United States Patent
Shinkle et al.

(10) Patent No.: US 10,247,762 B2
(45) Date of Patent: Apr. 2, 2019

(54) METHOD TO QUANTIFY CLOSED LOOP POSITION CONTROL HEALTH

(71) Applicant: General Electric Company, Schenectady, NY (US)

(72) Inventors: William Randolph Shinkle, Cincinnati, OH (US); Subrat Nanda, Houston, TX (US)

(73) Assignee: General Electric Company, Schenectady, NY (US)

( * ) Notice: Subject to any disclaimer, the term of this patent is extended or adjusted under 35 U.S.C. 154(b) by 468 days.

(21) Appl. No.: 14/968,282

(22) Filed: Dec. 14, 2015

(65) Prior Publication Data

US 2017/0168095 A1    Jun. 15, 2017

(51) Int. Cl.
*G01R 17/02* (2006.01)

(52) U.S. Cl.
CPC .................. *G01R 17/02* (2013.01)

(58) Field of Classification Search
CPC ...................................................... G01R 17/02
USPC ......................................................... 702/189
See application file for complete search history.

(56) References Cited

U.S. PATENT DOCUMENTS

| | | | |
|---|---|---|---|
| 6,646,397 B1 | 11/2003 | Discenzo | |
| 7,113,834 B2 * | 9/2006 | Wojsznis | G05B 11/42 700/31 |
| 8,700,360 B2 | 4/2014 | Garimella et al. | |
| 9,752,512 B2 * | 9/2017 | Furukawa | F02C 9/20 |
| 2008/0221710 A1 * | 9/2008 | Brunell | G05B 5/01 700/45 |
| 2014/0257528 A1 * | 9/2014 | Perez | G05B 13/047 700/46 |
| 2014/0337256 A1 * | 11/2014 | Varadi | G05B 13/04 706/12 |

* cited by examiner

*Primary Examiner* — Ricky Ngon
(74) *Attorney, Agent, or Firm* — Fletcher Yoder, P.C.

(57) ABSTRACT

A monitoring system includes a processor configured to calculate a first distance of a first signal, wherein the first distance represents changes in magnitude of the first signal over a period of time, and wherein the first signal is associated with a desired signal output of a feedback loop system. The processor is configured to receive a second signal from an output of the feedback loop system. The processor is configured to calculate a second distance of the second signal, wherein the second distance represents changes in magnitude of the second signal over the period of time. The processor is configured to determine a first difference between the first distance and the second distance. The processor is configured to provide an error signal indicating an error if the difference exceeds a threshold value.

20 Claims, 6 Drawing Sheets

METHOD TO QUANTIFY CLOSED LOOP POSITION CONTROL HEALTH

BACKGROUND

The subject matter disclosed herein relates to feedback, and more particularly, to assessing health of a feedback signal.

Feedback signals may be used with control systems in a variety of industries, such as in automotive or power generation industries. In the power generation industry, various engines, such as gas, steam, or diesel engines, may use one or more feedback signals to control a variety of electric or hydraulic actuators, such as lever arms, vane angles, or the like. Frequently, feedback in control systems is desirable to determine and/or control a difference between an actual signal and a reference signal. For example, electrical power output from a gas engine may be fed back and used as an input to compare the power generated to the desired power generated.

A feedback signal that does not accurately represent the output signal can cause a variety of operational problems for closed loop control. For example, if the feedback signal is unstable, erratic, or noisy, the difference between the feedback signal and the reference signal may be inaccurate as well, thereby causing incorrect adjustments by the system receiving the feedback signal. For the foregoing reasons, it may be beneficial to improve assessment of feedback signals.

BRIEF DESCRIPTION

Certain embodiments commensurate in scope with the originally claimed disclosure are summarized below. These embodiments are not intended to limit the scope of the claimed disclosure, but rather these embodiments are intended only to provide a brief summary of possible forms of the disclosure. Indeed, the disclosure may encompass a variety of forms that may be similar to or different from the embodiments set forth below.

In a first embodiment, a monitoring system includes a processor configured to calculate a first distance of a first signal, wherein the first distance represents changes in magnitude of the first signal over a period of time, and wherein the first signal is associated with a desired signal output of a feedback loop system, receive a second signal from an output of the feedback loop system, calculate a second distance of the second signal, wherein the second distance represents changes in magnitude of the second signal over the period of time, determine a first difference between the first distance and the second distance, and provide an error signal indicating an error if the difference exceeds a threshold value.

In a second embodiment, a non-transitory computer readable medium comprising instructions configured to be executed by a processor of a control system, wherein the instructions comprise instructions configured to cause the processor to calculate a first distance of a first signal, wherein the first distance represents changes in magnitude of the first signal over a period of time, and wherein the first signal is associated with a desired signal output of a feedback loop system, receive a second signal from an output of the feedback loop system, calculate a second distance of the second signal, wherein the second distance represents changes in magnitude of the second signal over the period of time, determine a first difference between the first distance and the second distance, and provide an error signal indicating an error if the difference exceeds a threshold value.

In a third embodiment, a method, comprising calculating a first distance of a first signal, wherein the first distance represents changes in magnitude of the first signal over a period of time, and wherein the first signal is associated with a desired signal output of a feedback loop system, receiving a second signal from an output of the feedback loop system, calculating a second distance of the second signal, wherein the second distance represents changes in magnitude of the second signal over the period of time, determining a first difference between the first distance and the second distance, and providing an error signal indicating an error if the difference exceeds a threshold value.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
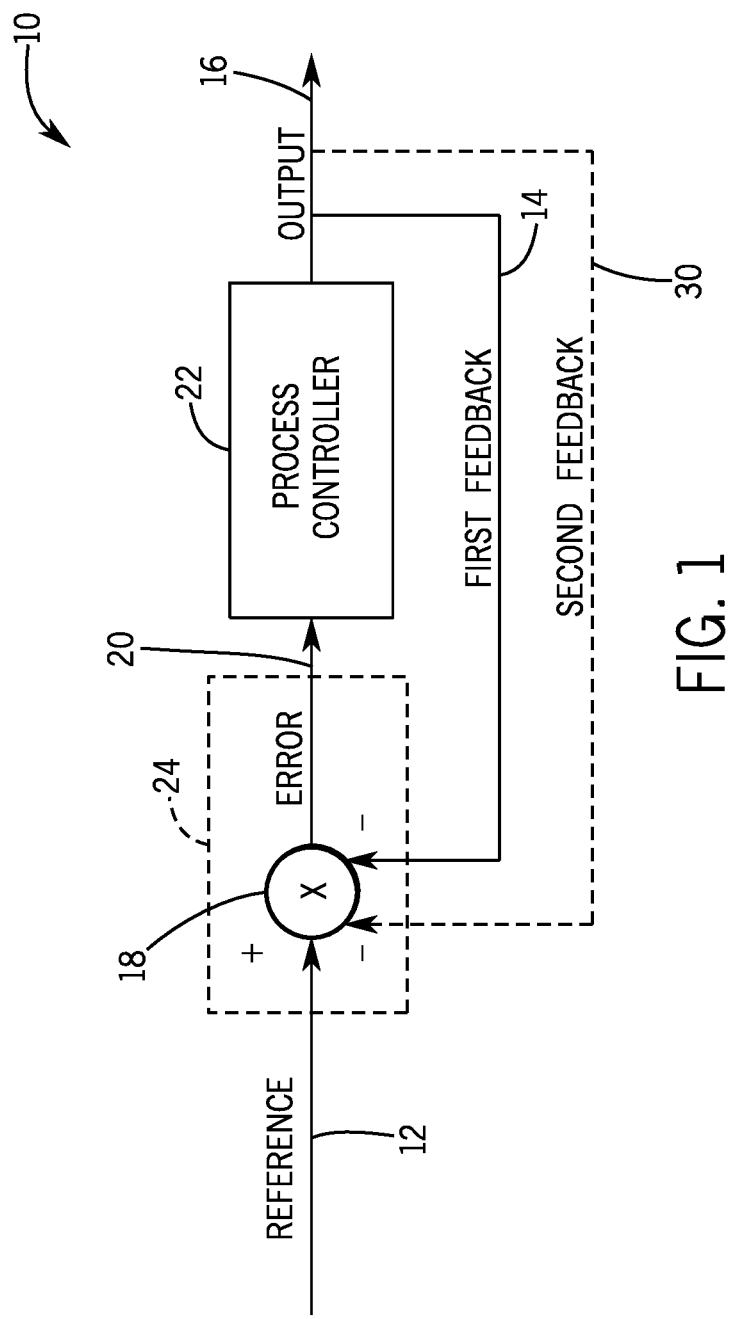
FIG. 1 is a block diagram of a feedback loop monitoring system, in accordance with an embodiment.

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

The system and method described below are related to assessing a health of a feedback signal. For example, many negative feedback control systems use an output signal as an input, called a feedback signal, to compare to a reference signal representing the desired output. Using the difference between the reference signal and the feedback signal, the control system can reduce an error between the feedback signal and the reference signal.

However, if the feedback signal is unstable, erratic, and/or noisy, the feedback signal can cause problems in the control process, because the feedback signal cannot be relied upon. For example, if the feedback signal is more erratic than the reference signal, then the feedback signal may be experiencing significant noise or a regulator that regulates an operational parameter of the feedback signal may be unstable. As another example, if the feedback signal changes over time less than the reference signal, it may indicate feedback system failure, such as actuator driver issues, because the feedback signal reflects the operation of actuators. Further, if multiple feedback signals are used (e.g., for redundancy), then it can be difficult identifying which of the feedback signals should be used and which of the signals are unhealthy. As such, it may be beneficial to have ways of determining health of a feedback signal The system and method described herein can determine an amount of noise or a degree of erraticism in a feedback signal as compared to a reference signal. For example, a processor of a monitoring system may calculate travel of a reference signal and travel of a feedback signal over a time period. As used herein, the distance traveled of a signal may be a length of a line that represents the signal between a first point in time and a second point in time. That is, as the magnitude of the signal changes over a given period of time more frequently, the length of the respective signal will increase, and, in the same manner, the distance traveled by the signal will also increase. As such, the distance traveled may indicate an amount of changes in magnitude over a period of time. The processor may determine a difference between the reference travel and the feedback travel. Then, the processor may provide an alert for erratic behavior of the feedback signal when the difference exceeds a threshold value.

Turning to the figures, FIG. 1 is an example of a control system 10 that is configured to receive a reference signal 12. For example, the reference signal 12 may be a demand signal for a variable stator vane (VSV-DMD), a bleed valve, or a vane lever arm that generates desired vane angles, pressures, voltages, currents, or other output of the control system 10. The reference signal 12 may be compared with one or more feedback signals that indicate the output of the system returned as an input. For example, the system may have a variable stator vane A feedback signal 14 (VSV-A) that provides a representation of an output 16 of the control system 10. A comparator 18 may generate an error signal 20 by comparing the reference signal 12 with the VSV-A feedback signal 14. The error signal 20 may then be received by a process controller 22, such as a proportional-integral-derivative (PID) controller, to generate an output signal 16 based on the error signal 20. The process controller 22 (e.g., PID controller) reduces the error signal 20 over time based on feedback data provided to the PID controller by adjusting one or more actuators.

It should be appreciated that these examples, such as variable stator vanes, bleed valves, or lever arms, are merely illustrative and are discussed merely to simplify explanation and to provide context for examples discussed herein. That is, while variable state vane angles are used as an example, the present approaches may be used in any suitable electronically and/or hydraulically actuated device that uses a feedback signal with a reference signal or demand signal, such as in control systems for gas, steam, or diesel engine or other control systems.

As described in detail below, the comparator 18 may be part of a monitoring system 24. The monitoring system 24 may be part of a feedback controller that generates the error signal 20 by comparing the reference signal 12 with the first feedback signal 14. As another example, the process controller 22 and the monitoring system 24 may be integrated into one system. In other embodiments, the monitoring system 24 of the present disclosure may be apart from the system.

The control system 10 may include more than one feedback signal for redundancy, such as a variable stator vane B feedback signal 30 (VSV-B). If the first feedback loop stops sending signals, then the control system 10 may rely on the second feedback loop. Similarly, if the second feedback loop stops sending signals, then the control system 10 may rely on the first feedback loop. However, it is often difficult to discern which signals can be relied upon due to a lack of information regarding whether each signal is providing accurate information and whether a portion of each signal includes noise or other interference factors. Moreover, it may be difficult to determine which input to believe in systems having two or more feedback signals.

Figure 2:
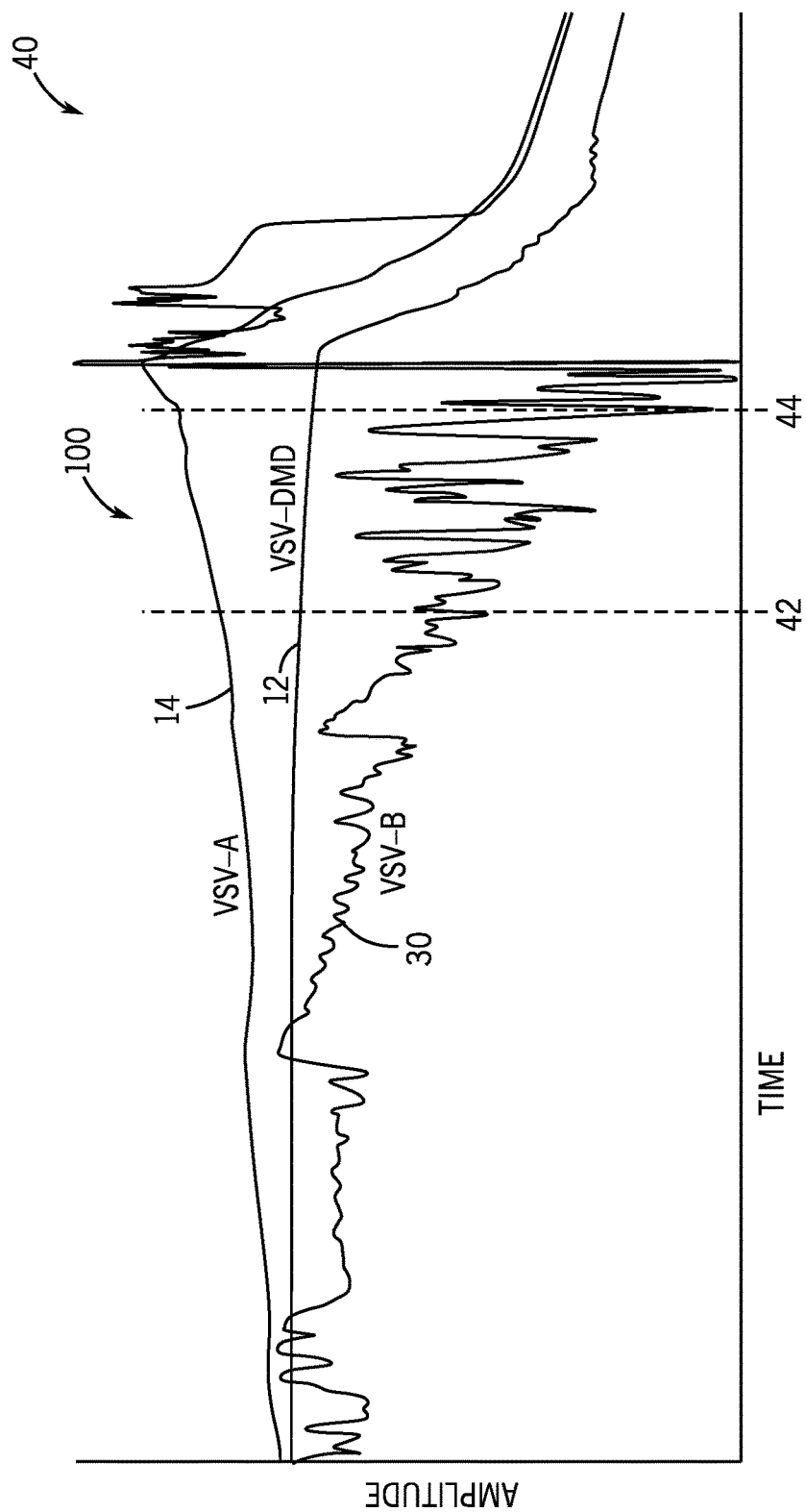
FIG. 2 is a graph of signals from the feedback loop monitoring system of FIG. 1, in accordance with an embodiment.

For example, one indication that a feedback signal may be unreliable is when the signal exhibits erratic behavior. FIG. 2 is a graph 40 of the feedback signals 14 and 30 and the reference signal 12 received by the monitoring system 24. While the graph 40 may be shown on a display of the monitoring system 24, the graph 40 is meant to be illustrative and the signals may instead be processed by the monitoring system 24 without displaying the data. As shown in the graph 40, the VSV-DMD reference signal 12 indicates the desired output 16 of the system. The VSV-A feedback signal 14 is a healthy signal that accurately reflects the measured output of the control system 10. In this example, VSV-A feedback signal 14 and VSV-B feedback signal 30 are monitoring the same output signal similar to the feedback signals of FIG. 1. However, the VSV-B feedback signal 30 is an example of an unreliable signal exhibiting erratic behavior. That is, the VSV-B feedback signal 30 fluctuates due to noise or other interference factors. As such, the VSV-B feedback signal 30 does not accurately reflect the measured output of the control system 10.

Erratic behavior may be characterized by rapid increases and/or decreases in the signal over a period of time. For example, between time 42 and time 44, the VSV-B feedback signal 30 increases and/or decreases several times in amplitude as compared to the VSV-A feedback signal 14, which primarily increases smoothly. As such, as will be described in detail with respect to FIG. 4 below, the VSV-B feedback signal 30 may be characterized as traveling a further distance than the VSV-A feedback signal 14 and/or the VSV-DMD reference signal 12. That is, a length of the line that represents the VSV-B feedback signal 30 between time 42 and time 44 may be determined and compared to a length of the line that represents the length of the VSV-A feedback signal 14. Since the VSV-B feedback signal 30 has more changes over the period of time, the length of the VSV-B feedback signal 30 may be significantly larger than the lengths of the VSV-A feedback signal 14 and/or the VSV-DMD reference signal 12. This greater distance traveled by the VSV-B feedback signal 30 may indicate erratic behavior.

Figure 3:
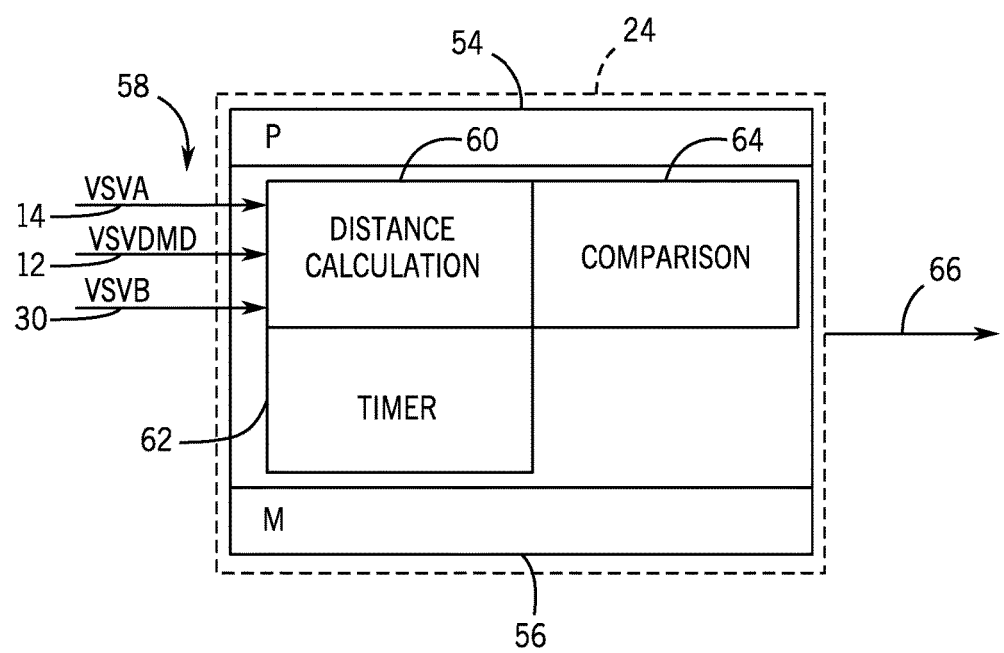
FIG. 3 is a block diagram of the feedback loop monitoring system of FIG. 1 for monitoring time to travel parameters, in accordance with an embodiment.

With this in mind, the monitoring system 24 may determine a distance of one or more feedback signals traveled over a given period of time to determine whether the signal can be relied upon. FIG. 3 is a block diagram of a monitoring system 24 that monitors feedback and reference signals of an electronically or hydraulically actuated device of a control system. The monitoring system 24 may determine whether one or more of the feedback signals 14 and 30 are unstable, erratic, and/or noisy.

The monitoring system 24 may include a processor 54 or multiple processors, memory 56, and inputs/outputs (i.e., I/O) 58. The processor 54 may be operatively coupled to the memory 56 to execute instructions for carrying out the presently disclosed techniques. These instructions may be encoded in programs or code stored in a tangible non-transitory computer-readable medium, such as the memory 56 and/or other storage. The processor 54 may be a general purpose processor (e.g., processor of a desktop/laptop computer), system-on-chip (SoC) device, or application-specific integrated circuit, or some other processor configuration. The memory 56, in the embodiment, includes a computer readable medium, such as, without limitation, a hard disk drive, a solid state drive, diskette, flash drive, a compact disc, a digital video disc, random access memory (RAM), and/or any suitable storage device that enables the processor 54 to store, retrieve, and/or execute instructions and/or data. The memory 56 may include one or more local and/or remote storage devices. The system 24 may include a wide variety of inputs/outputs 58 (i.e. I/O). For instance, the I/O 58 may include inputs for the VSV-A, VSV-B, and VSV-DMD signals 12, 14, and 30.

Instructions for the process described below may be stored in the memory 56 of the system 24 and executed as instructions by the processor 54 (e.g., running code). While the process described below may include instructions executed by the processor 54 as an example, the monitoring system 24 may include hardware to perform one or more of the processes. The processor 54 of the system 24 may access the VSV-A, VSV-B, and VSV-DMD signals 12, 14, and 30. The monitoring system 24 may include distance calculation component 60, timer component 62, and comparison component 64. As used herein, the distance calculation component 60, the timer component 62, and the comparison component 64 may be understood to refer to computing software, firmware, hardware (e.g., circuitry), or various combinations thereof. The distance calculation component 60, the timer component 62, and the comparison component 64 may include software implemented on hardware, firmware, or recorded on a processor readable storage medium, such as the memory 56. For example, referring to FIG. 2, the system 24 may use the timer component 62 to track time (e.g., between time 42 and time 44). The processor 54 may then enable the distance calculation component 60 to determine a distance traveled by one or more signals over the time period between time 42 and time 44. The processor 54 may then compare the distance traveled by the one or more signals with one another, via the comparison component 64, over the time period monitored by the timer component 62. The processor 54 may then generate an output signal 66 indicating erratic behavior of one or more of the feedback signals 14 and 30 when the compared values exceed a threshold. The output signal 66 may be sent to alarm circuitry, the feedback controller, the process controller 22, or the like. If the output signal 66 is sent to an alarm, for instance, an operator may use the output signal 66 to identify the erratic feedback signal for further testing. As another example, if the output signal 66 includes a command signal to control use of the feedback signal, the feedback controller may receive the command signal and rely on other feedback signals when there is redundancy.

Figure 4:
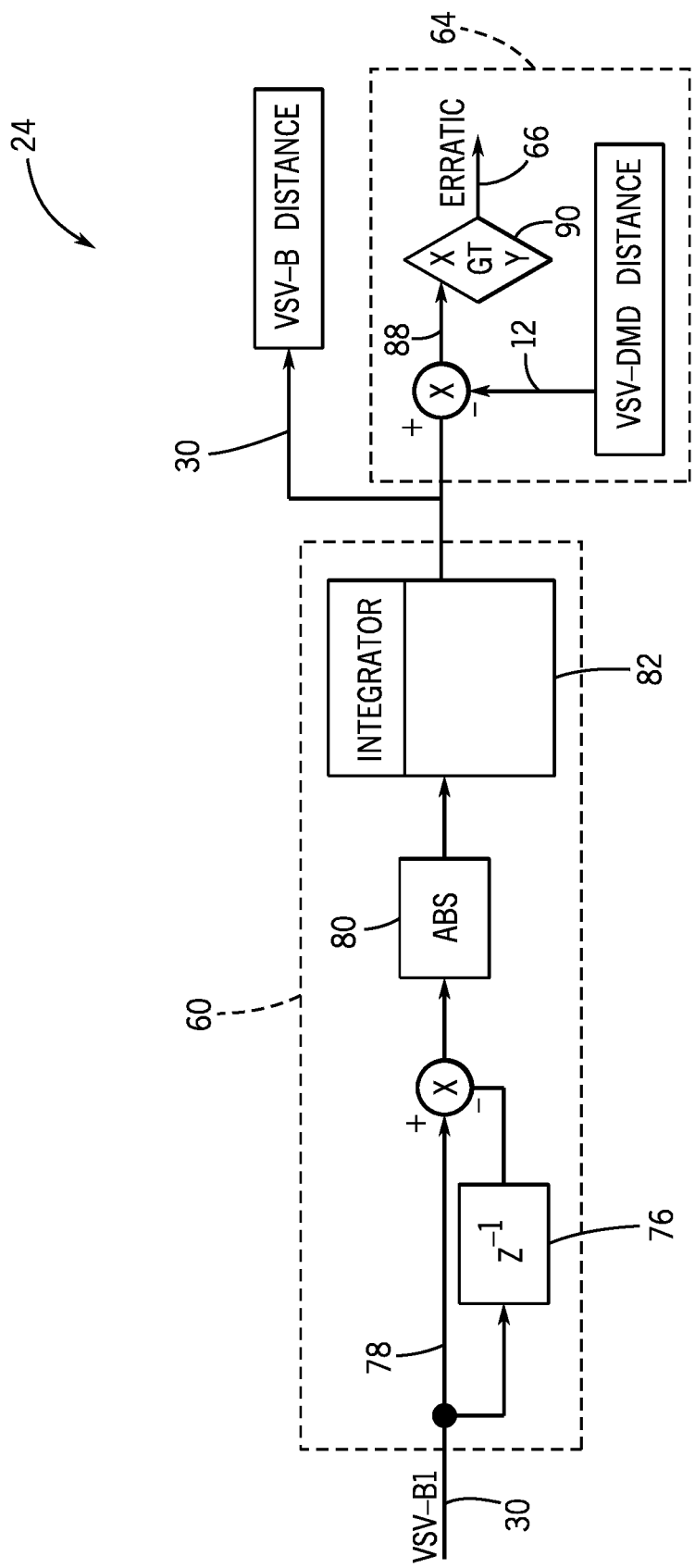
FIG. 4 is a schematic diagram of an embodiment of the monitoring system for calculating and comparing the monitored time to travel parameters of FIG. 3, in accordance with an embodiment.

To determine the distances traveled by signals, the processor 54 may determine the amount the VSV-B feedback signal 30 changes over a time segment. FIG. 4 is a diagram of the distance calculation component 60 and the comparison component 64. While the VSV-B feedback signal 30 is used here as an example, the VSV-A feedback signal 14 as well as the reference signal 12 may undergo a similar process. Initially, the processor 54 may, for example, verify a status of the VSV-B feedback signal 30 by determining whether measured values of the feedback signal are zero or approximately zero. If the feedback signal is zero or approximately zero, the processor 54 may provide a signal indicating that the VSV-B feedback signal 30 is invalid. The distance calculation component 60 may store a measured value 76 of an amplitude of the feedback signal 30 (e.g., in the memory 56). The distance calculation component 60 may then compare a measured value 78 of the amplitude of the feedback signal with the previous measured value 76. The distance calculation component 60 may then determine an absolute value 80 to determine a positive net change between the recent measured value 78 and the previous measured value 76. In other words, the distance calculation component 60 may determine an absolute value of a difference between a measured value and a previous measured value over a time segment to calculate the reference distance and/or the feedback distance. The distance calculation component 60 may then determine an integral 82 and/or sum the net changes with respect to time (e.g., over more than one time segment) to determine a distance of the VSV-B feedback signal 30. That is, the feedback distance and/or the reference distance indicates an amount the feedback signal and/or the reference signal change over a period of time.

The comparison component 64 may then compare the distance of the VSV-B signal 30 with one or more other distance measurements, such as the distance of the VSV-DMD signal 12, to determine a compared distance value 88. The comparison component 64 may determine whether the compared distance value 88 is greater than (90) a threshold value, then the VSV-B feedback signal 30 may be associated with erratic behavior. As such, the processor 54 may then generate the output signal 66.

Figure 5:
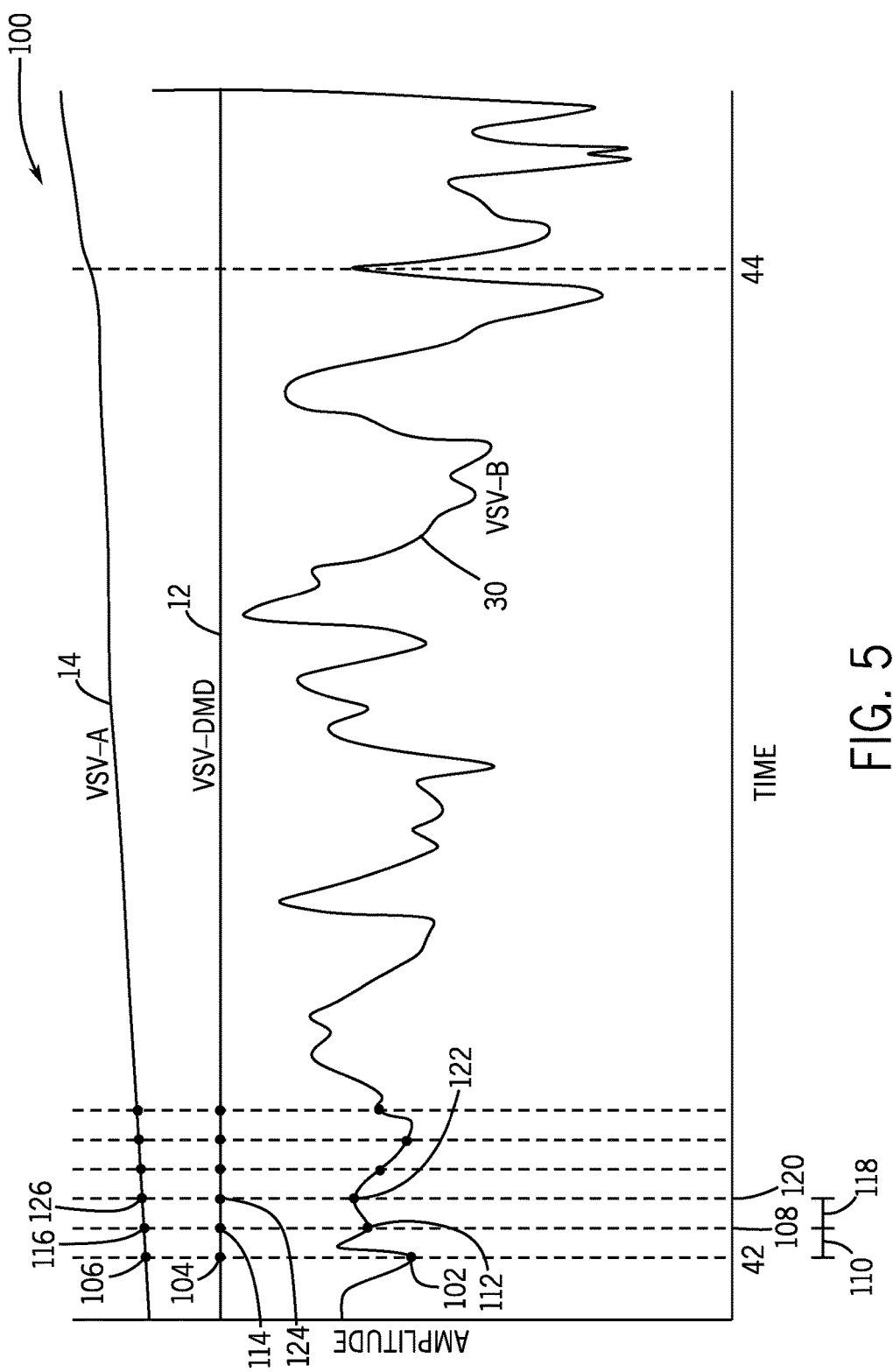
FIG. 5 is a graph of signals from the feedback loop monitoring system of FIG. 3 uses for monitoring travel, in accordance with an embodiment.

To determine if a signal is exhibiting erratic behavior, measured values of the signals may be taken at various times. FIG. 5 is a portion 100 of the graph 40 between time 42 and time 44 of FIG. 2 used below to explain how distance may be calculated in accordance with the distance calculation and comparison components and/or instructions of FIG. 4. The portion 100 shows the erratic behavior of VSV-B feedback signal 30, as well as the VSV-A feedback signal 14 and the VSV-DMD reference signal 12. As noted above, the process described herein is simply meant as an example of how distance may be calculated, and any suitable method may be used to determine distances of signals.

The timing component 62 may begin tracking a time period at time 42 over which distances are determined. The time period may be a preset time period. The processor 54 may then determine measured values 102, 104, and 106 for each of the signals 30, 12, and 14 respectively. The measured values 102, 104, and 106 may be stored (e.g., in the memory 56) to be used to compare later values. After a time segment 110, at time 108, the processor 54 may determine measured values 112, 114, and 116. The processor 54 may then subtract the measured value 112 from the previous measured value 102, subtract the measured value 114 from the previous measured value 104, and subtract the measured value 116 from the previous measured value 106 and take the absolute value 80 of the differences, as in FIG. 4. Note that the absolute value of the difference between the VSV-B feedback signal 30 values is larger than the difference between the VSV-A 14 and VSV-DMD reference signal 12 values as the VSV-B feedback signal 30 changes more than the VSV-A feedback signal 14 and the VSV-DMD reference signal 12 over the time segment 110. The processor 54 may then include the absolute values 80 in, for example, the integral 82 and/or a sum.

After the next time segment 118, the processor 54 may perform a similar step at time 120 with respect to measured values 122, 124, and 126 compared to values 112, 114, and 116 respectively. The absolute value of the compared values may again be included in the sum and/or integral 82 of FIG. 4 to find the distance traveled. Again, note that the distance of these VSV-B feedback signal 30 values is larger than the distance of the VSV-A feedback signal 14 and VSV-DMD reference signal 12 values. As this occurs over the period of time between time 42 and 44, the distance of the VSV-B feedback signal 30 may become significantly larger than the distance of the VSV-A feedback signal 14 and VSV-DMD reference signal 12 to where the difference (88) between the distance of the VSV-B feedback signal 30 and the VSV-DMD reference signal 12 and/or the VSV-A feedback signal 14 is greater than a threshold value (90). After the period of time between time 42 and 44, the timer 62 may be reset for further monitoring.

Figure 6:
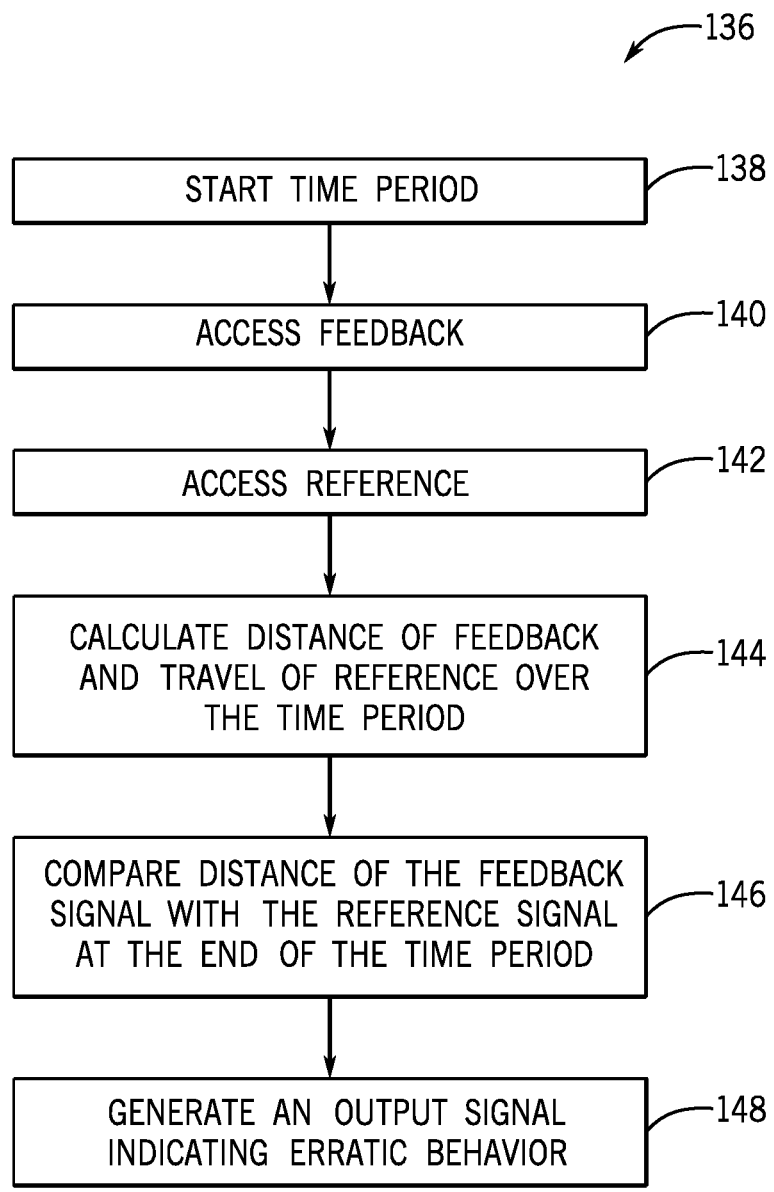
FIG. 6 is a flow diagram of a process performed by the feedback loop monitoring system of FIG. 3, in accordance with an embodiment.

One or more processes may be stored in the memory 56 of the system 24 and executed as instructions by the processor 54 (e.g., running code) to indicate when signals are exhibiting erratic behavior. FIG. 6 is an example of a process 136 that may be performed by the processor 54 in accordance with an embodiment of the disclosure. The process 136 may begin by the processor 54 starting a timer to begin a time period (block 138). Over the time period, the processor 54 may access the feedback signal (block 140) to determine measured values, such as measured value 102, at various points in time. The processor 54 may also access the reference signal (block 142) to determine measured values, such as measured value 104, at various points in time. The processor 54 may then use these measured values to calculate distance of the feedback and reference signals over a time period (block 144). For example, as explained with respect to FIG. 4, the processor 54 may determine a second measured value 112 for the VSV-B feedback signal 30. The processor 54 may then find a difference between the measured value 102 and the measured value 112. The processor 54 may determine an absolute value of the difference and include the absolute value 80 in a summation or integral 82 to determine a distance traveled, as shown in FIG. 4. At the end of the time period, the processor 54 may then compare distance of the feedback signal with the reference signal (block 146). For example, as shown in FIG. 4, if the compared distances are greater than a threshold value 90, then the compared distances may indicate that the feedback signal is exhibiting erratic behavior. Depending on the compared distances, the processor 54 may generate an output signal 66 to indicate that a signal is exhibiting erratic behavior.

This written description uses examples to enable a person of ordinary skill in the art to practice the disclosure, including the best mode, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A monitoring system, comprising:
a processor configured to:
calculate a first travel distance of a first signal, wherein the first travel distance corresponds to a first linear distance representative of the first signal over a period of time, and wherein the first signal is associated with a desired signal output of a feedback loop system;
receive a second signal from an output of the feedback loop system;
calculate a second travel distance of the second signal, wherein the second travel distance corresponds to a second linear distance representative of the second signal over the period of time;
determine a first difference between the first travel distance and the second travel distance; and
provide an error signal indicating an error in response to the first difference exceeding a threshold value, wherein the error signal causes one or more actuators to adjust one or more positions of one or more vanes associated with an engine.

2. The monitoring system of claim 1, wherein the error signal comprises an alert transmitted to a computing system.

3. The monitoring system of claim 1, wherein the processor is configured to rely on a third signal from the output of the feedback loop system in response to the first difference exceeding the threshold value.

4. The monitoring system of claim 1, comprising determining a connection status between a sensor providing the second signal and the one or more actuators, based on the second travel distance being greater than zero or approximately zero.

5. The monitoring system of claim 1, wherein the processor is configured to determine an absolute value of a second difference between a first measured value of the second signal at a first time and a second measured value of the second signal at a second time to calculate the second travel distance.

6. The monitoring system of claim 1, wherein the processor is configured to determine the second travel distance based on a plurality of changes in magnitude of the second signal over a plurality of time segments within the period of time.

7. The monitoring system of claim 6, wherein the processor is configured to calculate the second travel distance by summing the plurality of changes over the period of time.

8. The monitoring system of claim 1, wherein the processor is configured to control one or more operational parameters of an engine based on a comparison of the first and second signals.

9. The monitoring system of claim 8, wherein the one or more operational parameters comprise a voltage, current, or power to operate an electrical actuator, a hydraulic actuator, or any combination thereof of the engine.

10. A non-transitory computer readable medium comprising instructions configured to be executed by a processor of a control system, wherein the instructions comprise instructions configured to cause the processor to:
calculate a first travel distance of a first signal, wherein the first travel distance comprises a first linear distance representative of the first signal over a period of time, and wherein the first signal is associated with a desired signal output of a feedback loop system;

receive a second signal from an output of the feedback loop system;

calculate a second travel distance of the second signal, wherein the second travel distance comprises a second linear distance representative of the second signal over the period of time;

determine a first difference between the first travel distance and the second travel distance; and provide an error signal indicating an error in response to the first difference exceeding a first threshold value, wherein the error signal causes one or more actuators to adjust one or more positions of one or more vanes associated with an engine.

11. The non-transitory computer readable medium of claim 10, wherein the instructions comprise instructions configured to cause the processor to:

receive a third signal from the output of the feedback loop system;

calculate a third travel distance of the third signal, wherein the third travel distance comprises a third linear distance representative of the third signal over the period of time;

determine a second difference between the first travel distance and the third travel distance; and provide the error signal in response to the second difference exceeding a second threshold value.

12. The non-transitory computer readable medium of claim 11, wherein the instructions comprise instructions configured to cause the processor to reduce reliance on the second signal in the feedback loop system in response to the first difference exceeding the first threshold value and reduce reliance on the third signal in the feedback loop system in response to the second difference exceeding the second threshold value.

13. The non-transitory computer readable medium of claim 10, wherein the instructions are configured to reset a timer at the end of the period of time.

14. The non-transitory computer readable medium of claim 10, wherein the instructions cause the processor to calculate the second travel distance based on a plurality of changes in magnitude of the second signal over a plurality of time segments within the period of time.

15. A method, comprising:

calculating, via a processor, a first travel distance of a first signal, wherein the first travel distance comprises a first linear distance representative of the first signal over a period of time, and wherein the first signal is associated with a desired signal output of a feedback loop system;

receiving, via the processor, a second signal from an output of the feedback loop system;

calculating, via the processor, a second travel distance of the second signal, wherein the second travel distance comprises a second linear distance representative of the second signal over the period of time;

determining, via the processor, a first difference between the first travel distance and the second travel distance; and providing, via the processor, an error signal indicating an error in response to the first difference exceeding a threshold value, wherein the error signal causes one or more actuators to adjust one or more positions of one or more vanes associated with an engine.

16. The method of claim 15, comprising utilizing, via the processor, a third signal from the output of the feedback loop system to control the feedback loop system in response to the first difference exceeding the threshold value.

17. The method of claim 15, comprising calculating, via the processor, the second travel distance based on a plurality of changes in magnitude of the second signal over a plurality of time segments within the period of time.

18. The method of claim 17, comprising calculating, via the processor, the second travel distance by summing the plurality of changes over the period of time.

19. The method of claim 15, wherein calculating the second travel distance comprises determining, via the processor, an absolute value of a second difference between a first measured value of the second signal at a first time and a second measured value of the second signal at a second time.

20. The method of claim 15, comprising detecting, via the processor, an inactive actuator based on the first travel distance and the second travel distance being equal to zero or approximately zero.

* * * * *